United States Patent
Wei et al.

(10) Patent No.: US 6,566,184 B1
(45) Date of Patent: May 20, 2003

(54) PROCESS TO DEFINE N/PMOS POLY PATTERNS

(75) Inventors: Zin-Chein Wei, Hsin-Chu (TW); Chuan-Chieh Huang, Hsin-Chu (TW); Chih-Hsiung Lee, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/082,015

(22) Filed: Feb. 21, 2002

(51) Int. Cl.[7] .......................................... H01L 21/8238
(52) U.S. Cl. ...................................... 438/232; 438/532
(58) Field of Search ................................. 438/199, 231, 438/232, 279, 283, 527, 532

(56) References Cited

U.S. PATENT DOCUMENTS

| | | | |
|---|---|---|---|
| 6,103,603 A | * 8/2000 | Han | 438/532 |
| 6,171,889 B1 | 1/2001 | Iwamatsu et al. | 438/162 |
| 6,191,044 B1 | 2/2001 | Yu et al. | 438/713 |
| 6,258,641 B1 | 7/2001 | Wong et al. | 438/199 |
| 6,391,704 B1 | * 5/2002 | Hong et al. | 438/532 |
| 6,399,432 B1 | * 6/2002 | Zheng et al. | 438/232 |

* cited by examiner

*Primary Examiner*—Chandra Chaudhari
(74) *Attorney, Agent, or Firm*—George O. Saile; Stephen B. Ackerman; Stephen G. Stanton

(57) ABSTRACT

A method of fabricating doped polysilicon structures comprising the following steps. A substrate is provided and an undoped polysilicon layer is formed over the substrate. The undoped polysilicon layer is patterned to form at least one undoped polysilicon structure within an N area and at least one undoped polysilicon structure within a P area. The at least one undoped polysilicon structure within the N area is masked, leaving exposed an upper portion of the other at least one undoped polysilicon structure within the P area. The exposed at least one undoped polysilicon structure within the P area is doped to form a P-doped polysilicon structure. An upper portion of the masked at least one undoped polysilicon structure within the N area is unmasked and exposed, and the P-doped polysilicon structure is masked. The exposed at least one undoped polysilicon structure within the N area is doped to form an N-doped polysilicon structure to complete fabrication of the doped polysilicon structures.

34 Claims, 7 Drawing Sheets

PROCESS TO DEFINE N/PMOS POLY PATTERNS

BACKGROUND OF THE INVENTION

For device process concerns, sometimes N metal-oxide semiconductor (MOS) and PMOS implants were required before defining polysilicon (poly) lines to avoid interfering with subsequent NLDD implants as in 0.10 μm technology. The poly line etch process has to be fine tuned when using pre-doped poly film. However, when using pre-doped poly film it is very difficult to get a good poly line pattern, especially for pre-doped poly films having different implant dosages and implant species. Further, since the etch bias is different between the NMOS and PMOS portions of the pre-doped poly film, a separate NMOS pre-doped poly etch and a separate PMOS pre-doped poly etch are required for proper process control.

U.S. Pat. No. 6,171,889 B1 to Iwamatsu et al. describes an N & P MOS process where the poly is N and P doped after deposition and the N poly is doped before patterning.

U.S. Pat. No. 6,258,641 B1 to Wong et al. describes an N/PMOS poly patterning process using a triple well method.

U.S. Pat. No. 6,191,044 B1 to Yu et al. describes an NMOS and PMOS process using a controlled poly gate profile.

SUMMARY OF THE INVENTION

Accordingly, it is an object of one or more embodiments of the present invention to provide a improved process of forming NMOS and PMOS poly structures.

Other objects will appear hereinafter.

It has now been discovered that the above and other objects of the present invention may be accomplished in the following manner. Specifically, a substrate is provided and an undoped polysilicon layer is formed over the substrate. The undoped polysilicon layer is patterned to form at least one undoped polysilicon structure within an N area and at least one undoped polysilicon structure within a P area. The at least one undoped polysilicon structure within the N area is masked, leaving exposed an upper portion of the other at least one undoped polysilicon structure within the P area. The exposed at least one undoped polysilicon structure within the P area is doped to form a P-doped polysilicon structure. An upper portion of the masked at least one undoped polysilicon structure within the N area is unmasked and exposed, and the P-doped polysilicon structure is masked. The exposed at least one undoped polysilicon structure within the N area is doped to form an N-doped polysilicon structure to complete fabrication of the doped polysilicon structures.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
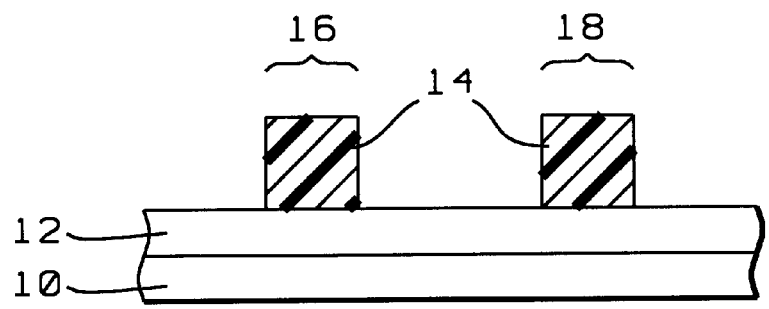
FIGS. 1 to 10 schematically illustrate a first preferred embodiment of the present invention.

As shown in FIG. 1, structure 10 includes an undoped polysilicon (poly) film/layer 12 formed therein to a thickness of preferably from about 1000 to 2500 Å and more preferably from about 1000 to 1500 Å. Structure 10 is preferably a silicon substrate and is understood to possibly include a semiconductor wafer or substrate.

A patterned mask layer 14 may be used to mask an poly structure areas 16 and 18. Patterned mask layer 14 is preferably comprised of photoresist, TEOS oxide, SiON or PEOX and is more preferably photoresist as shown in FIG. 1.

Patterning of Undoped Poly Film 12

Figure 2:
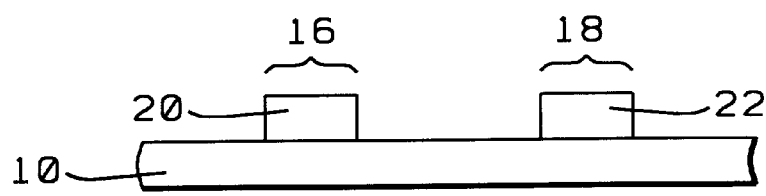

As shown in FIG. 2, undoped poly film 12 is patterned to form poly structures 20 and 22. Undoped poly film 12 may be patterned using patterned mask layer 14 as shown in FIG. 1 or otherwise. Patterned mask layer 14, if used, is stripped and removed.

Since poly film 12 is undoped when patterned, a consistent profile and critical dimension (CD) bias are achieved in forming poly structures 20, 22.

Poly structures 20, 22 may be lines or gates, for example.

Formation of First Photoresist Layer 24

Figure 3:
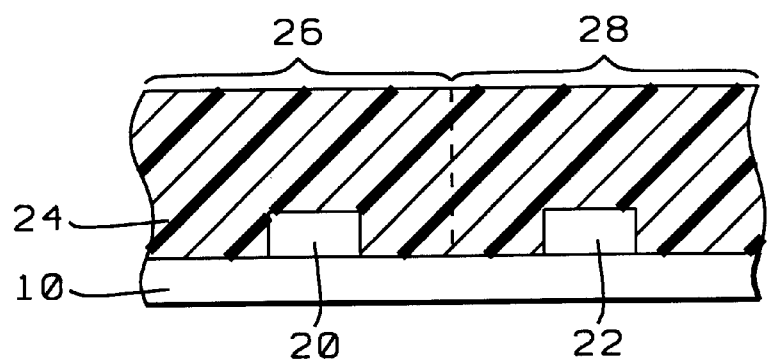

As shown in FIG. 3, first photoresist layer 24 is formed over poly structures 20, 22 and substrate 10. First photoresist layer 24 includes N area 26 over poly structure 20 and P area 28 over poly structure 22.

Only the first photoresist layer 24 within P area 28 is then light exposed.

Dry Development of First Photoresist Layer 24

Figure 4:
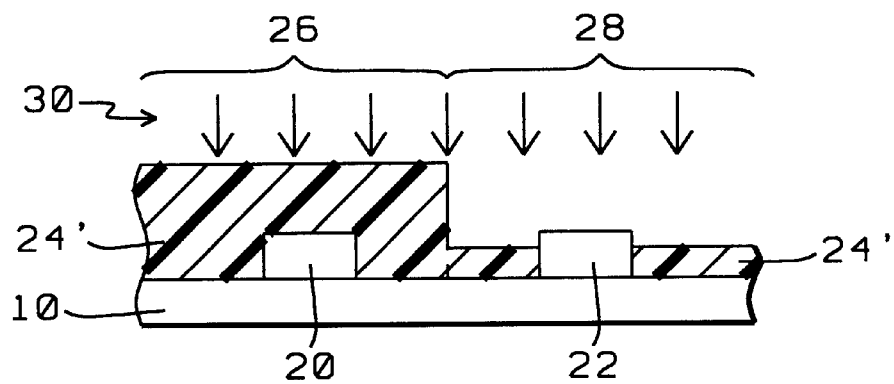

As shown in FIG. 4, partially light exposed first photoresist layer 24 is dry developed 30 using an O2 plasma with a dry developer tool. The light exposed photoresist within P area 28 is etched at a greater rate than the non-exposed photoresist within N area 26 and the dry development process 30 is controlled so that only the upper portion of undoped poly structure 22 is exposed while undoped poly structure 20 is covered by the non-exposed photoresist within N area 26.

It is noted that partially light exposed first photoresist layer 23 is not wet developed.

PMOS Implant 32

Figure 5:
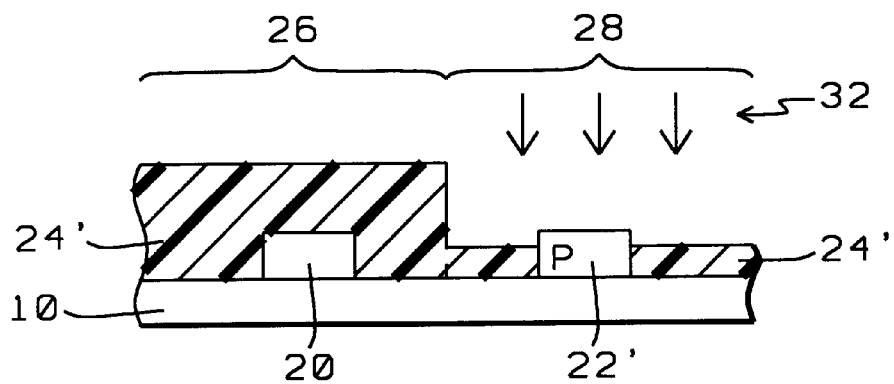

As shown in FIG. 5, a PMOS implant 32 is performed into the exposed upper portion of poly structure 22 to form P-doped poly structure 22'. PMOS implant 32 will self-align on the poly structure 22 and will not affect the OD surface.

Strip Dry Developed Photoresist Layer 24'

Figure 6:
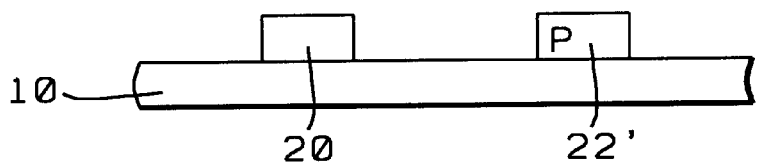

As shown in FIG. 6, dry developed first photoresist layer 24' is stripped and removed.

Formation of Second Photoresist Layer 25

Figure 7:
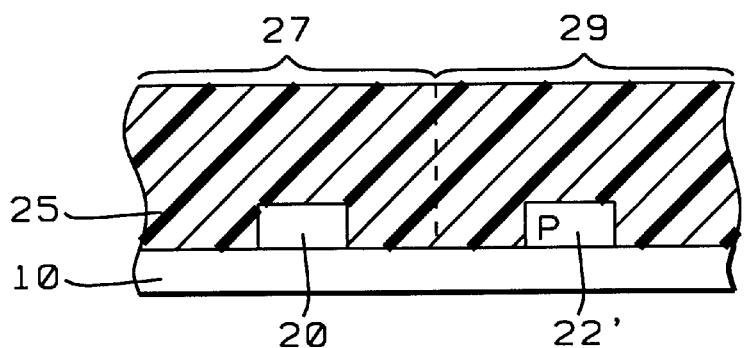

As shown in FIG. 7, second photoresist layer 25 is formed over undoped poly structures 20, P-doped poly structure 22' and substrate 10. Second photoresist layer 25 includes N area 27 over undoped poly structure 20 and P area 29 over P-doped poly structure 22'.

Only the second photoresist layer 25 within N area 27 is then light exposed.

Dry Development of Second Photoresist Layer 25

Figure 8:
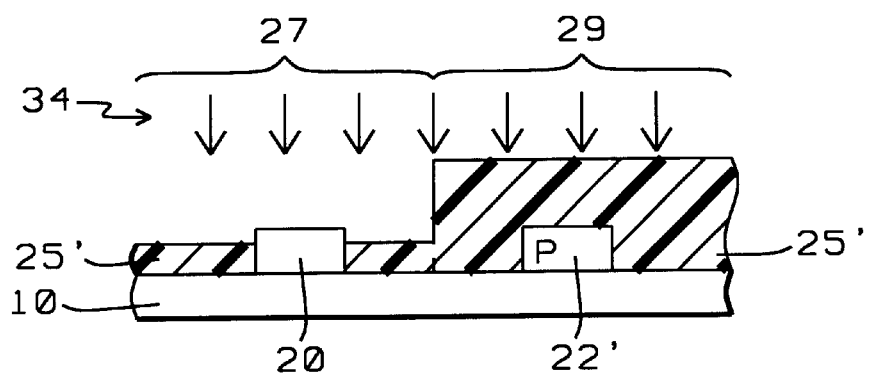

As shown in FIG. 8, partially light exposed second photoresist layer 25 is dry developed 34 using an O2 plasma with a dry developer tool. The light exposed photoresist within N area 27 is etched at a greater rate than the non-exposed photoresist within P area 29 and the dry development process 34 is controlled so that only the upper portion of undoped poly structure 20 is exposed while the P-doped poly structure 22' is covered by the non-exposed photoresist within P area 29.

It is noted that partially light exposed second photoresist layer 25 is not wet developed.

NMOS Implant 36

Figure 9:
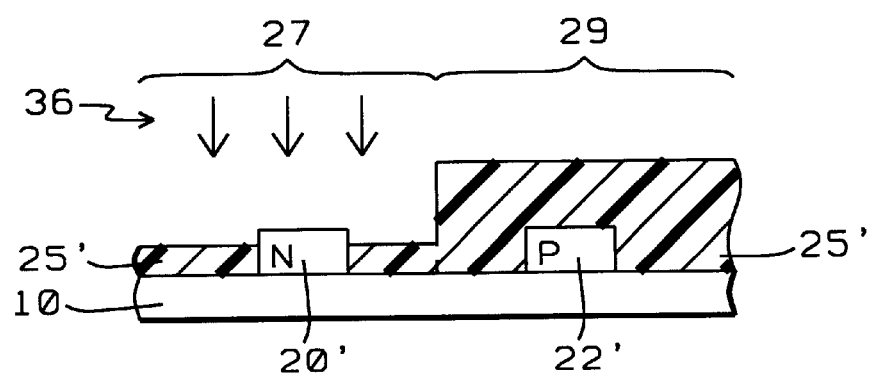

As shown in FIG. 9, an NMOS implant 36 is performed into the exposed upper portion of undoped poly structure 20 to form N-doped poly structure 20'. NMOS implant 36 will self-align on the poly structure 20 and will not affect the OD surface.

Strip Dry Developed Second Photoresist Layer 25'

Figure 10:
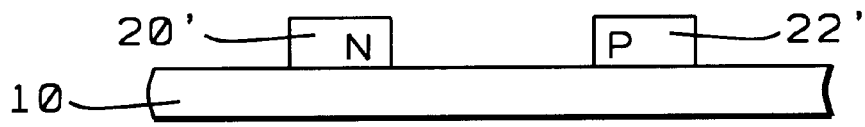

As shown in FIG. 10, dry developed second photoresist layer 25' is stripped and removed leaving N-doped poly structure 20' and P-doped poly structure 22'.

It is noted that the N-doped poly structure 20' may be doped first, before the P-doped poly structure 22'.

Initial Structure

Figure 11:
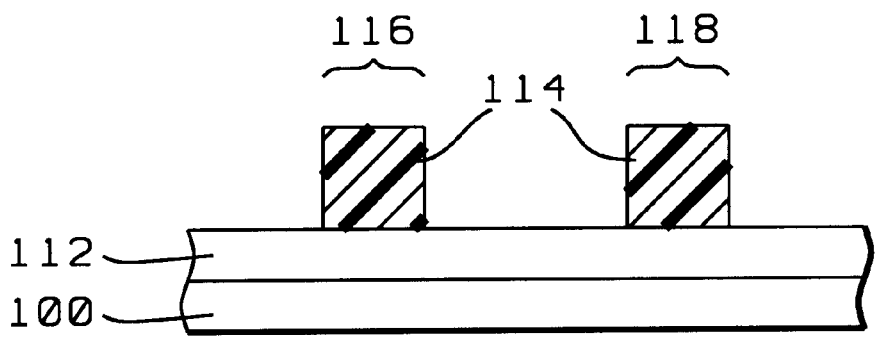
FIGS. 11 to 20 schematically illustrate a second preferred embodiment of the present invention.

As shown in FIG. 11, structure 100 includes an undoped polysilicon (poly) film/layer 112 formed therein to a thickness of preferably from about 1000 to 2500 Å and more preferably from about 1000 to 1500 Å. Structure 100 is preferably a silicon substrate and is understood to possibly include a semiconductor wafer or substrate.

A patterned mask layer 114 may be used to mask an poly structure areas 116 and 118. Patterned mask layer 114 is preferably comprised of photoresist, TEOS oxide, SiON or PEOX and is more preferably photoresist as shown in FIG. 11.

Patterning of Undoped Poly Film 112

Figure 12:
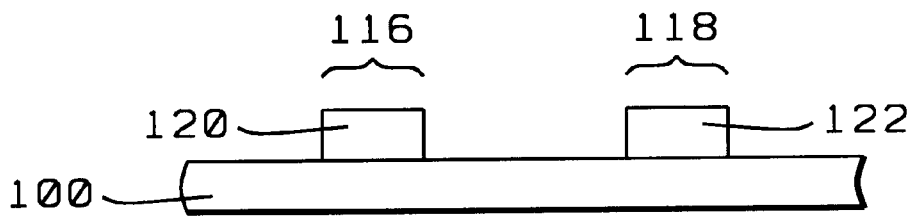

As shown in FIG. 12, undoped poly film 112 is patterned to form poly structures 120 and 122. Undoped poly film 112 may be patterned using patterned mask layer 114 as shown in FIG. 11 or otherwise. Patterned mask layer 114, if used, is stripped and removed.

Since poly film 112 is undoped when patterned, a consistent profile and critical dimension (CD) bias are achieved in forming poly structures 120, 122.

Poly structures 120, 122 may be lines or gates, for example.

Formation of Photoresist Layer 124

Figure 13:
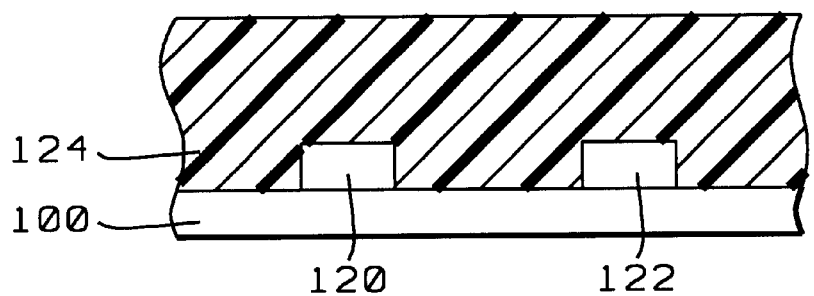

As shown in FIG. 13, first photoresist layer 124 is formed over poly structures 120, 122 and substrate 100.

First photoresist layer 124 is comprised of a photoresist that is not developed by the subsequent NMOS and/or PMOS implant lithography processes as described below and is preferably comprised of photoresist or a bottom anti-reflective coating (BARC) layer and is more preferably a BARC layer.

Etch Back of First Photoresist Layer 124

Figure 14:
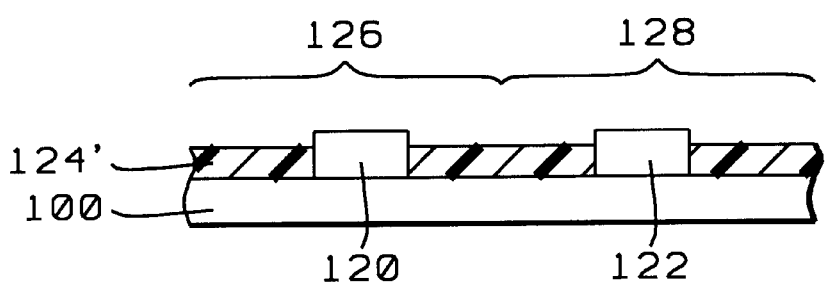

As shown in FIG. 14, first photoresist layer 124 is etched back for a time sufficient to expose only the upper portions of undoped poly structures 120, 122. The outside diameter (OD) or sidewalls of the undoped poly structures 120, 122 are protected by the remaining photoresist layer 124'. Etched-back first photoresist layer 124' includes N area 126 over undoped poly structure 120 and P area 128 over undoped poly structure 122.

Formation of First Masking Layer 134 and PMOS Implant 132

Figure 15:
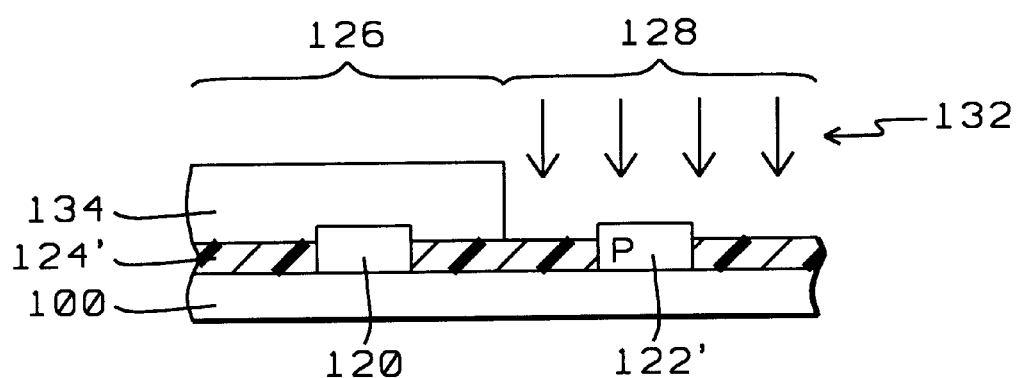

As shown in FIG. 15, first masking layer 134 is formed over etched-back photoresist layer 124' within N area 126, covering undoped poly structure 120. A PMOS implant 132 is then performed into the exposed upper portion of undoped poly structure 122 to form P-doped poly structure 122'. PMOS implant 132 will self-align on the poly structure 122 and will not affect the OD surface.

First masking layer 134 is comprised of photoresist.

Strip First Masking Layer 134 and Etched-Back First Photoresist Layer 124'

Figure 16:
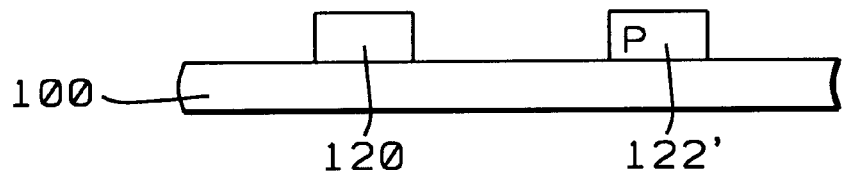

As shown in FIG. 16, first masking layer 134 and etched-back first photoresist layer 124' are stripped and removed.

Formation of Second Photoresist Layer 125

Figure 17:
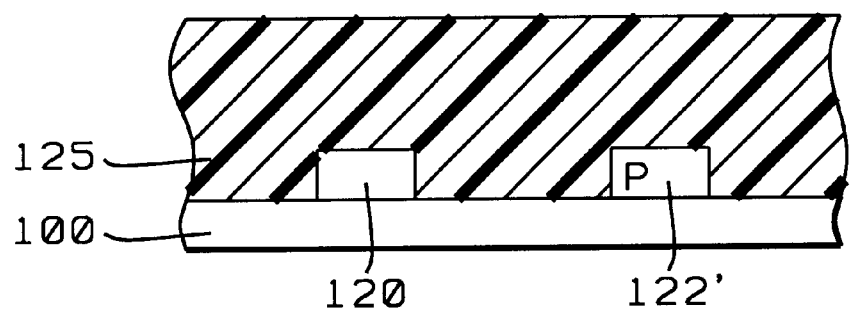

As shown in FIG. 17, second photoresist layer 125 is formed over undoped poly structure 120, P-doped poly structure 122' and substrate 100.

Second photoresist layer 125 is comprised of a photoresist that is not developed by the subsequent NMOS implant lithography processes as described below and is preferably comprised of photoresist or a bottom anti-reflective coating (BARC) layer and is more preferably a BARC layer.

Etch Back of Second Photoresist Layer 125

Figure 18:
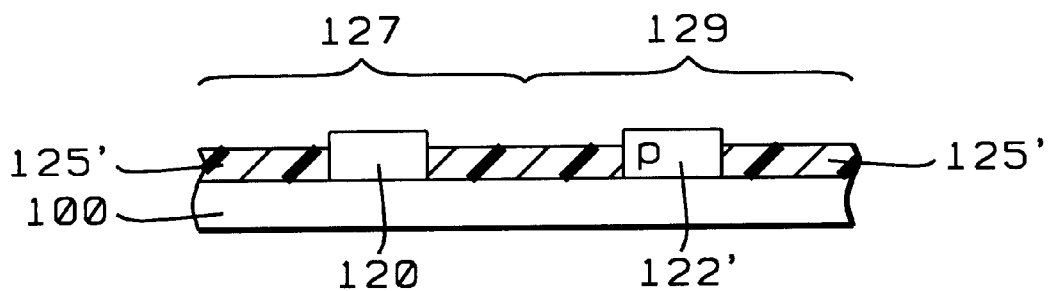

As shown in FIG. 18, second photoresist layer 125 is etched back for a time sufficient to expose only the upper portions of undoped poly structures 120 and P-doped poly structure 122. The outside diameter (OD) or sidewalls of the undoped poly structure 120, and the P-doped poly structure 122 are protected by the remaining photoresist layer 125'. Etched-back second photoresist layer 125' includes N area 127 over undoped poly structure 120 and P area 129 over P-doped poly structure 122'.

Formation of Second Masking Layer 136 and NMOS Implant 137

Figure 19:
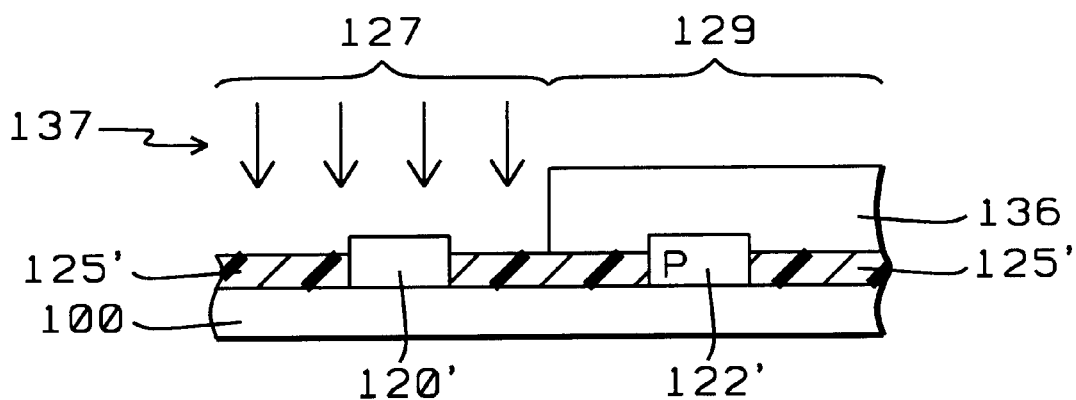

As shown in FIG. 19, second masking layer 136 is formed over etched-back second photoresist layer 125' within P area 129, covering P-doped poly structure 122'. An NMOS implant 137 is then performed into the exposed upper portion of undoped poly structure 120 to form N-doped poly structure 120'. NMOS implant 137 will self-align on the poly structure 120 and will not affect the OD surface.

Second masking layer 136 is comprised of photoresist.

Strip Second Masking Layer 136 and Etched-Back Second Photoresist Layer 125'

Figure 20:
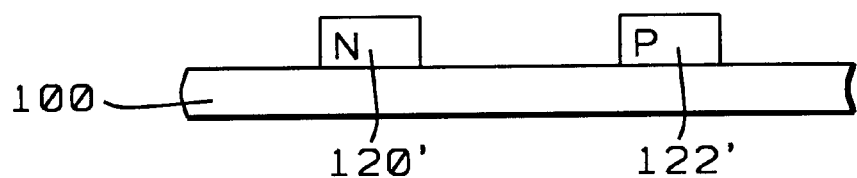

As shown in FIG. 20, second masking layer 136 and etched-back second photoresist layer 125' are stripped and removed.

It is noted that the N-doped poly structure 120' may be doped first, before the P-doped poly structure 122'.

Advantages of the Present Invention

The advantages of one or more embodiments of the present invention include:

1. the present invention uses a simple poly photoresist and etch process, just like the generic process;
2. the NMOS/PMOS poly profile and CD bias will be mutually consistent and easily controllable;
3. the NMOS/PMOS implants self-align on the patterned poly film without affecting the OD surfaces;
4. the additional photoresist coating, etch back and strip processes have no side effect on the device; and
5. the NMOS and/or PMOS implant dosage may be modified as needed or required without concern to the poly etch profile and etch bias since the poly is etched/patterned before any NMOS/PMOS implant.

While particular embodiments of the present invention have been illustrated and described, it is not intended to limit the invention, except as defined by the following claims.

We claim:

1. A method of fabricating doped polysilicon structures, comprising the steps of:
   providing a substrate;
   forming an undoped polysilicon layer over the substrate;
   patterning the undoped polysilicon layer to form at least one undoped polysilicon structure within an N area and at least one undoped polysilicon structure within a P area;
   masking the:
     substrate; and
     at least one undoped polysilicon structure within the N area leaving exposed an upper portion of the other at least one undoped polysilicon structure within the P area;
   doping the exposed at least one undoped polysilicon structure within the P area to form a P-doped polysilicon structure;
   unmasking and exposing an upper portion of the masked at least one undoped polysilicon structure within the N area and masking the:
     substrate; and
     the P-doped polysilicon structure; and
   doping the exposed at least one undoped polysilicon structure within the N area to form an N-doped polysilicon structure to complete fabrication of the doped polysilicon structures.

2. The method of claim 1, wherein the at least one N-doped polysilicon structure is formed before the at least one P-doped polysilicon structure.

3. The method of claim 1, wherein the polysilicon structures are gates.

4. The method of claim 1, wherein the substrate is a silicon substrate.

5. The method of claim 1, wherein the undoped polysilicon layer has a thickness of from about 1000 to 2500 Å.

6. The method of claim 1, wherein the undoped polysilicon layer has a thickness of from about 1000 to 1500 Å.

7. The method of claim 1, wherein the undoped polysilicon layer is patterned using an overlying patterned mask layer.

8. The method of claim 1, wherein the undoped polysilicon layer is patterned using an overlying patterned mask layer; the overlying patterned mask layer being comprised of a material selected from the group consisting of photoresist, TEOS oxide, SiON and PEOX.

9. The method of claim 1, wherein the undoped polysilicon layer is patterned using an overlying patterned mask layer; the overlying patterned mask layer being comprised of photoresist.

10. A method of fabricating doped polysilicon structures, comprising the steps of:
    providing a substrate;
    forming an undoped polysilicon layer over the substrate;
    patterning the undoped polysilicon layer to form at least one undoped polysilicon structure within an N area and at least one undoped polysilicon structure within a P area;
    forming a first photoresist layer over the substrate, covering and masking the N and P area polysilicon structures;
    light exposing only the first photoresist layer within the P area; whereby the P area light exposed first photoresist layer is removed at a greater rate than the N area non-light exposed first photoresist layer during dry development;
    dry developing the partially exposed first photoresist layer to unmask only an upper portion of the P area polysilicon structure;
    doping the unmasked P area polysilicon structure to form a P-doped polysilicon structure;
    removing the dry developed first photoresist layer;
    forming a second photoresist layer over the substrate, covering and masking the N area polysilicon structure and the P-doped polysilicon structure;
    light exposing only the second photoresist layer within the N area; whereby the N area light exposed second photoresist layer is removed at a greater rate than the P area non-light exposed second photoresist layer during dry development;
    dry developing the partially exposed second photoresist layer to unmask only an upper portion of the N area polysilicon structure; and
    doping the unmasked N area polysilicon structure to form a N-doped polysilicon structure to complete fabrication of the doped polysilicon structures.

11. The method of claim 10, wherein the polysilicon structures are gates.

12. The method of claim 10, wherein the N-doped polysilicon structure is formed before the P-doped polysilicon structure.

13. The method of claim 10, wherein the substrate is a silicon substrate.

14. The method of claim 10, wherein the undoped polysilicon layer has a thickness of from about 1000 to 2500 Å.

15. The method of claim 10, wherein the undoped polysilicon layer has a thickness of from about 1000 to 1500 Å.

16. The method of claim 10, wherein the first and second partially exposed photoresist layers are developed using a dry developer tool.

17. The method of claim 10, wherein the first and second partially exposed photoresist layers are developed using an $O_2$ plasma.

18. The method of claim 10, including the steps of:
    removing the dry developed second photoresist layer after forming the N-doped polysilicon structure; and
    further processing the structure.

19. The method of claim 10, wherein the undoped polysilicon layer is patterned using an overlying patterned mask layer.

20. The method of claim 10, wherein the undoped polysilicon layer is patterned using an overlying patterned mask layer; the overlying patterned mask layer being comprised of a material selected from the group consisting of photoresist, TEOS oxide, SiON and PEOX.

21. The method of claim 10, wherein the undoped polysilicon layer is patterned using an overlying patterned mask layer; the overlying patterned mask layer being comprised of photoresist.

22. A method of fabricating doped polysilicon structures, comprising the steps of:

providing a substrate;

forming an undoped polysilicon layer over the substrate;

patterning the undoped polysilicon layer to form at least one undoped polysilicon structure within an N area and at least one undoped polysilicon structure within a P area;

forming a first photoresist layer over the substrate, covering and masking the N and P area polysilicon structures;

etching back the first photoresist layer to expose only the upper portions of the N and P area polysilicon structures;

forming a first masking layer over the N area polysilicon structure and the etched back first photoresist layer only within the N area;

doping the unmasked P area polysilicon structure to form a P-doped polysilicon structure;

removing the first masking layer to expose the N area polysilicon structure;

forming a second masking layer over the P area polysilicon structure;

doping the unmasked N area polysilicon structure to form an N-doped polysilicon structure to complete fabrication of the doped polysilicon structures.

23. The method of claim 22, wherein the polysilicon structures are gates.

24. The method of claim 22, wherein the N-doped polysilicon structure is formed before the P-doped polysilicon structure.

25. The method of claim 22, wherein the substrate is a silicon substrate.

26. The method of claim 22, wherein the undoped polysilicon layer has a thickness of from about 1000 to 2500 Å.

27. The method of claim 22, wherein the undoped polysilicon layer has a thickness of from about 1000 to 1500 Å.

28. The method of claim 22, wherein the first and second masking layers are comprised of photoresist.

29. The method of claim 22, including the step of further processing the structure after formation of the P-doped and N-doped polysilicon structure.

30. The method of claim 22, including the steps of:

removing the first etched back first photoresist layer with the removal of the first masking layer;

forming a second photoresist layer over the substrate, covering and masking the N area undoped polysilicon structure and the P area P-doped polysilicon structure;

etching back the second photoresist layer to expose only the upper portions of the N area undoped polysilicon structure and the P area P-doped polysilicon structure;

then forming the second masking layer over the P area P-doped polysilicon structure and the etched back second photoresist layer only within the P area; and then proceeding with the doping of the unmasked N area polysilicon structure to complete fabrication of the doped polysilicon structures.

31. The method of claim 22, including the steps of:

removing the first etched back first photoresist layer with the removal of the first masking layer;

forming a second photoresist layer over the substrate, covering and masking the N area undoped polysilicon structure and the P area P-doped polysilicon structure;

etching back the second photoresist layer to expose only the upper portions of the N area undoped polysilicon structure and the P area P-doped polysilicon structure;

then forming the second masking layer over the P area P-doped polysilicon structure and the etched back second photoresist layer only within the P area; and then proceeding with the doping of the unmasked N area polysilicon structure to complete fabrication of the doped polysilicon structures.

32. The method of claim 22, wherein the undoped polysilicon layer is patterned using an overlying patterned mask layer.

33. The method of claim 22, wherein the undoped polysilicon layer is patterned using an overlying patterned mask layer; the overlying patterned mask layer being comprised of a material selected from the group consisting of photoresist, TEOS oxide, SiON and PEOX.

34. The method of claim 22, wherein the undoped polysilicon layer is patterned using an overlying patterned mask layer; the overlying patterned mask layer being comprised of photoresist.

* * * * *